United States Patent [19]
Ohta et al.

[11] Patent Number: 5,403,683
[45] Date of Patent: Apr. 4, 1995

[54] PHOTO-MASK

[75] Inventors: Kenji Ohta; Junji Hirokane; Akira Shibata; Yoshiyuki Nagahara; Kazuo Van; Michinobu Mieda; Tetsuya Inui, all of Nara, Japan

[73] Assignee: Sharp Kabushiki Kaisha, Osaka, Japan

[21] Appl. No.: 102,229

[22] Filed: Aug. 5, 1993

Related U.S. Application Data

[60] Division of Ser. No. 631,277, Dec. 20, 1990, Pat. No. 5,260,150, which is a division of Ser. No. 450,438, Dec. 14, 1989, Pat. No. 5,079,113, which is a continuation-in-part of Ser. No. 250,750, Sep. 29, 1988, abandoned.

[30] Foreign Application Priority Data

| | | | |
|---|---|---|---|
| Sep. 30, 1987 | [JP] | Japan | 62-246653 |
| Sep. 30, 1987 | [JP] | Japan | 62-246654 |
| Sep. 30, 1987 | [JP] | Japan | 62-246655 |

[51] Int. Cl.$^6$ ............................................. G03F 9/00
[52] U.S. Cl. ........................................ 430/5; 430/321; 428/203; 428/209; 427/164; 427/595
[58] Field of Search .................. 430/5, 311, 321, 322, 430/327; 428/203, 209; 427/40, 164

[56] References Cited
U.S. PATENT DOCUMENTS

| | | | |
|---|---|---|---|
| 4,256,778 | 3/1981 | Mizukami et al. | 427/10 |
| 4,368,230 | 1/1983 | Mizukami et al. | 428/203 |
| 4,440,841 | 4/1984 | Tabuchi | 430/5 |
| 4,735,890 | 4/1988 | Nakane | 430/311 |

FOREIGN PATENT DOCUMENTS 57-41639  3/1982  Japan .

*Primary Examiner*—S. Rosasco
*Attorney, Agent, or Firm*—Birch, Stewart, Kolasch & Birch

[57] ABSTRACT

A photo-mask comprises a light-permeable substrate, a plurality of light-shielding films that are disposed on the substrate, the light-shielding films forming a mask pattern, and a light-permeable protective film that is disposed over the surface of the substrate including the light-shielding films so as to protect the light-shielding films.

12 Claims, 2 Drawing Sheets

PHOTO-MASK

This application is a divisional of application Ser. No. 07/631,277, filed on Dec. 20, 1990, now U.S. Pat. No. 5,260,150, which is a divisional of application Ser. No. 07/450,438, filed on Dec. 14, 1989, now U.S. Pat. No. 5,079,113, which is a CIP application of Ser. No. 07/250,750, filed Sep. 29, 1988, now abandoned, the entire contents of which are hereby incorporated by reference.

BACKGROUND OF THE INVENTION

1. Field of the Invention

This invention relates to a photo-mask that is used in the manufacture of optical memory devices with which information can be optically recorded, reproduced and erased.

2. Description of the Prior Art

A conventional photo-mask is composed of, as shown in FIG. 6, a light-permeable substrate 11 and patterned metal films 12 of Ta, Cr, Ti or the like that are buried in the substrate 11. Another conventional photo-mask is composed of, as shown in FIG. 7, a light-permeable substrate 11 and patterned metal films 12 that are disposed on the top surface of the substrate 11. When guide grooves with a width of 0.6–1.3 μm are formed on a glass substrate that constitutes an optical memory device by the use of the photo-mask, the photo-mask must be brought into contact with a photo-resist that has been disposed on the glass substrate, so that the mask-pattern of the metal films 12 can be transferred onto the photo-resist.

When the transference of the photo-mask onto the photo-resist is conducted, the photo-mask is stained because a piece of the photo-resist sticks to the photo-mask and/or dust enters into a gap between the photo-resist and the photo-mask. To remove the stain from the photo-mask, the photo-mask is subjected to an ultrasonic washing treatment, which causes peeling-off of the metal films 12, resulting in a loss of the mask-pattern of the metal films 12. Moreover, when the photo-mask shown in FIG. 6 is brought into contact with a photo-resist that has been formed on the glass substrate of an optical memory device, static electricity occurs and is accumulated in the light-permeable substrate 11 that is non-conductive, which causes damage in the metal films 12.

SUMMARY OF THE INVENTION

The photo-mask of this invention, which overcomes the above-discussed and numerous other disadvantages and deficiencies of the prior art, comprises a light-permeable substrate, a plurality of light-shielding films that are disposed on said substrate, said light-shielding films forming a mask pattern, and a light-permeable protective film that is disposed over the surface of said substrate including said light-shielding films so as to protect said light-shielding films.

In a preferred embodiment, the protective film is made of a conductive substance.

In a preferred embodiment, the protective film is made of a dielectric substance.

In a preferred embodiment, the light-shielding films are buried in said substrate so that the top surface of each of said light-shielding films is flush with the top surface of said substrate.

In a preferred embodiment, the light-shielding films are disposed on the top surface of said substrate.

In a preferred embodiment, the light-shielding films are buried in said substrate so that the upper portion of each of said light-shielding films projects from the top surface of said substrate.

Another photo-mask of this invention comprises a light-permeable substrate and a plurality of light-shielding films that form a mask-pattern, wherein said light-shielding films are buried in said substrate so that the top surface of each of said light-shielding films either above or below, but is not flush with the top surface of said substrate.

In a preferred embodiment, the light-shielding films are made of a conductive substance and project above the top surface of said substrate.

Thus, the invention described herein makes possible the objectives of (1) providing a photo-mask in which light-shielding films are protected by a protective film so that the light-shielding films cannot be peeled off, resulting in an elongation of the life of the photo-mask; and (2) providing a photo-mask in which if the above-mentioned protective film is conductive, when the photo-mask is brought into contact with a photo resist that has been disposed on the glass substrate of an optical memory device, the said conductive film comes into contact with the said photo-resist, and accordingly static electricity neither arises nor is accumulated in the light-permeable substrate of the photo-mask so that damage of the metal films of the photo-mask can be prevented, resulting in an enlargement of the life of the photo-mask.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
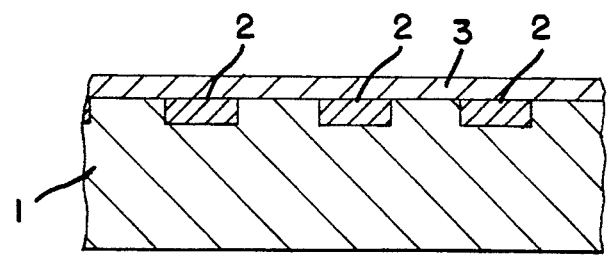
FIG. 1 is a sectional view showing a portion of a photo-mask of this invention.

FIG. 1 shows a photo-mask of this invention, which comprises a light-permeable substrate 1 that is made of quartz, soda lime, or the like, a plurality of metal films 2 that are buried in the substrate 1, and a light-permeable film 3 that is disposed over the surface of the substrate 1 including the metal films 2.

The surface of each of the metal films is flush with the top surface of the substrate 1. The metal films 2 are made of Ta, Ti, Cr, Mo, or the like that is a metal material for shielding light. The metal films 2 can be also made of a substance such as TaSi, MoSi, or the like containing at least one of the above-mentioned metal materials. The metal films 2 are positioned in the substrate 1 as follows: The substrate 1 is etched so that the given portions of the substrate 1 can be removed, and the above-mentioned metal film material is disposed in the etched portions of the substrate 1, resulting in the light-shielding metal films 2 that form a desired mask-pattern. Light such as ultraviolet rays with which the substrate 1 is irradiated is shielded by the patterned metal films 2. When a negative-type photo-resist is used for the manufacture of the guide grooves of an optical memory device, the above-mentioned metal films 2 are located on the portions of the substrate 1 that correspond to the portions of the photo-resist to be removed by a development treatment, whereas when a positive-type photo-resist is used, the above-mentioned metal films 2 are located on the portions of the substrate 1 that correspond to the portions of the photo-resist to remain after a development treatment.

The light-permeable film 3 that functions to protect the metal films 2 is made of a dielectric substance such as $SiO_2$ or the like. The thickness of the $SiO_2$ film 3 is set to be preferably around 30–300 nm. When the $SiO_2$ film 3 is exceedingly thin, the protection of the metal films 2 is reduced. When the $SiO_2$ film 3 is exceedingly thick, the transference of the mask-pattern of the metal films 2 onto the photo-resist that has been disposed on a glass substrate that constitutes an optical memory device cannot be carried out with absolute accuracy.

Because the metal films 2 are covered with the $SiO_2$ film 3, even when the photo-mask is subjected to an ultrasonic washing treatment, the metal films 2 are not peeled off. Moreover, the $SiO_2$ film 3 tends to adhere to an $SiO_2$ component contained in the substrate 1 that is made of a glass material such as quartz, soda lime, or the like, so that the $SiO_2$ film 3 becomes an excellent protective film for protecting the metal films 2.

The photo-mask of this invention that is composed of a quartz substrate 1, chromium (Cr) films 2 and an $SiO_2$ film 3 was in fact used for the production of the guide grooves of the glass substrate of an optical memory device. The transferring process was repeated several thousands of times by the use of the photo-mask of this invention and a loss of the mask-pattern of the metal films 2 was not observed. On the contrary, the mask-pattern of a reference control photo-mask that has no $SiO_2$ film 3 was damaged after the transferring process was repeated several times.

The photo-mask of this invention is useful for the manufacture of an optical memory device such as an opt-magnetic disk or the like. In general, the opt-magnetic disk has a metal thin film as a memory medium that is made of an alloy of rare earth elements and transition elements. The thin alloy film tends to deteriorate due to moisture and/or oxygen. By the use of the photo-mask of this invention, the glass substrate of an optical memory device is exposed to light to form a latent image corresponding to the guide groove pattern, and the glass substrate is subjected to a development treatment and an etching treatment, resulting in guide grooves in the glass substrate. Then, thin alloy film of rare earth elements and transition elements is formed on the said glass substrate. According to the above-mentioned way, because there is little possibility that oxygen and/or moisture will reach the memory medium through the glass substrate, resulting in a high quality optical memory device.

Although this example discloses only an $SiO_2$ film 3 as a protective film, other protective films made of dielectric substances can be employed so long as they are light-permeable, examples of which are a nitride such as AlN, $Si_3N_4$, TaN, or the like; an oxide such as $Al_2O_3$, $TiO_2$, $Ta_2O_5$, or the like; or an alloy of the above-mentioned metals. Although the above-mentioned metal film 2 is a single film made of the above-mentioned metal, it can be also a double-layered film or a triple-layered film made of the said metal and an oxide of the said metal. Moreover, the light-shielding film is not limited to the metal films 2, but it can be films made of other materials by which light is shielded and by which a mask-pattern can be formed.

Example 2

Figure 2:
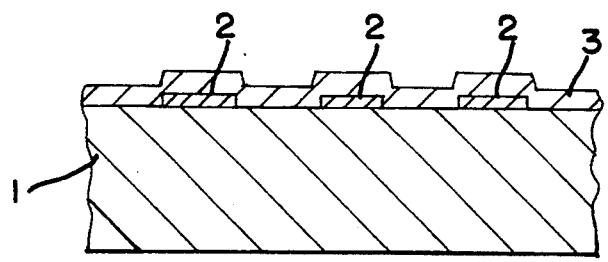
FIG. 2 is a sectional view showing a portion of another photo-mask of this invention.

FIG. 2 shows another photo-mask of this invention, which comprises a light permeable substrate 1 that is made of a glass board of quartz, soda lime or the like, or a plastic board of acrylic resin, epoxy resin, or the like, a plurality of metal films 2 that are disposed on the top surface of the substrate 1, and a light-permeable film 3 that is disposed over the top surface of the substrate 1 including the metal films 2.

The metal films 2 form a mask pattern such as that of Example 1. Because the metal films 2 are not buried in the substrate 1, the formation of the metal films 2 on the substrate 1 can be easily carried out.

Example 3

The photo-mask of this example is shown in FIG. 1 in which the light-permeable film 3 is made of a conductive material such as Ta, Ti, Mo, Ni, AuCr, $InO_2$, or the like. When the light-permeable film 3 is composed of a Ta thin film, the thickness thereof is set to be, for example, around 2–10 nn.

The Ta thin film 3 of the photo-mask is brought into contact with a photo-resist that has been formed on the glass substrate of an optical memory device, and the glass substrate is irradiated with ultraviolet rays through the photo-mask. Thereafter, the glass substrate is subjected to a development treatment and an etching treatment, resulting in guide grooves in the glass substrate. Because the Ta thin film 3 that is conductive comes into contact with the photo-resist, static electricity neither occurs nor is accumulated in the glass substrate during the light-exposure process.

Figure 3:
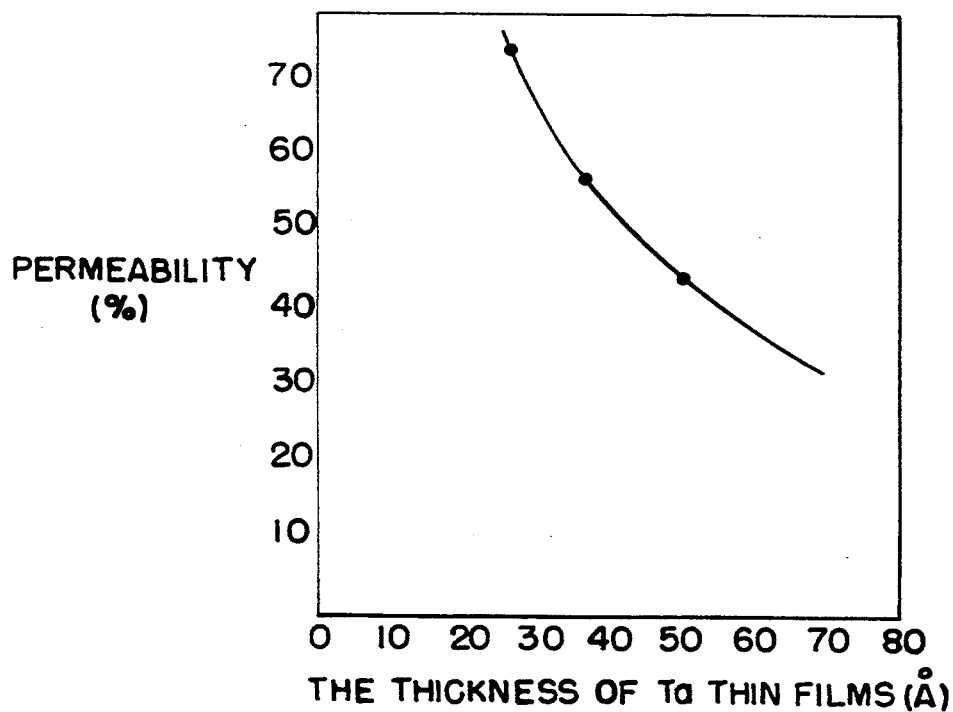
FIG. 3 is of a graph showing the relationship between the thickness of a conductive film of Ta and the permeability of ultraviolet rays in the cases where the light-permeable film that is disposed on the light-permeable substrate is conductive.

FIG. 3 shows the relationship between the thickness of the Ta thin film 3 and the permeability of ultraviolet rays, indicating that the permeability of ultraviolet rays is reduced with an increase in the thickness of the Ta thin film 3. Nevertheless, if the irradiating time of ultraviolet rays is enlarged with an increase in the thickness of the Ta thin film 3, a sufficient amount of light-exposure can be compensated.

Example 4

Figure 4:
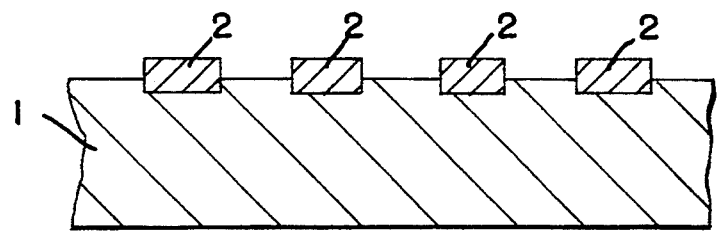
FIG. 4 is a sectional view showing a portion of another photo-mask of this invention.

FIG. 4 shows another photo-mask of this invention, which comprises a light-permeable substrate 1 that is made of quartz, soda lime, or the like and metal films 2 that is made of a conductive substance such as Ta, Ti, Ni, Cr, Co, TaSi, MoSi, or the like. The metal films 2 are buried in the light-permeable substrate 1 so that an upper portion of each of the metal films 2 can project from the top surface of the light-permeable substrate 1. Accordingly, when the metal films 2 of the photo-mask are brought into contact with a photo-resist that has been formed on the glass substrate of an optical memory device, because the top surface of the light-permeable substrate 1 of the photo-mask keeps away from the photo-resist, occurrence or accumulation of static electricity in the light-permeable substrate 1 of the photo-mask can be suppressed and the metal films 2 are not damaged.

Moreover, when the metal films 2 of the photo-mask are brought into contact with the photo-resist disposed on the glass substrate, because the area of the photo-mask that comes into contact with the photo-resist is smaller than that of a photo-mask in which the surface of each of the metal films 2 is flush with the top surface of the substrate 1, the photo-mask of this example can be readily removed from the photo-resist after the transference of the mask-pattern of the photo-mask onto the photo-resist is carried out.

Example 5

This example provides a photo-mask, which is the same photo-mask as mentioned in Example 4 (FIG. 4), except that the light-permeable film mentioned in Example 1 covers the top surface of the substrate 1 including the metal films 2.

Example 6

Figure 5:
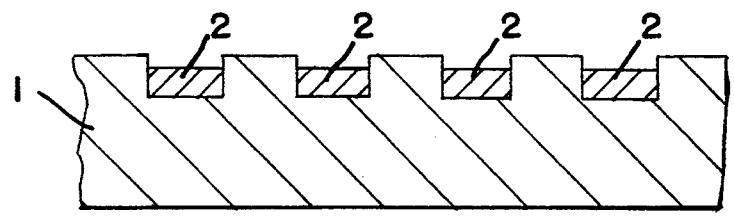
FIG. 5 is a sectional view showing a portion of another photo-mask of this invention.
Figure 6:
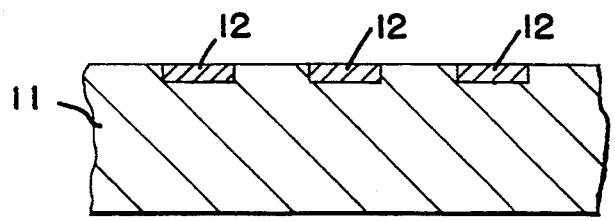
FIG. 6 is a sectional view showing a portion of a conventional photo-mask of this invention.
Figure 7:
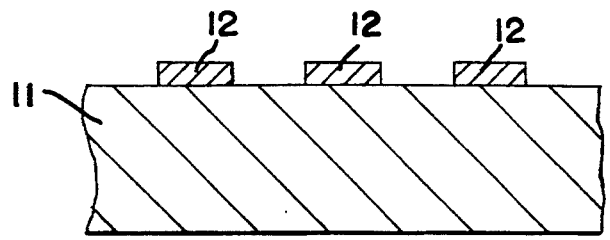
FIG. 7 is a sectional view showing a portion of another conventional photo-mask of this invention.

FIG. 5 shows another photo-mask of this invention, in which the metal films 2 are buried in the light-permeable substrate 1 so that the top surface of the substrate 1 is not flush with the top surface of each of the metal films 2; namely, the top surface of each of the metal films is lower than the top surface of the substrate 1. Thus, when the photo-mask is brought into contact with a photo-resist that has been formed on the glass substrate of an optical memory device, the area of the photo-mask that comes into contact with the photo-resist is smaller than that of a photo-mask in which the top surface of each of the metal films 2 is flush with the top surface of the substrate 1, so that the photo-mask can be readily removed from the photo-resist after the transference of the mask-pattern of the photo-mask onto the photo-resist is carried out.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A photo-mask comprising a light-permeable substrate and a plurality of light-shielding films that are disposed on the substrate, the light-shielding films forming a mask-pattern, wherein the photo-mask further comprises a light-permeable protective film which covers the surfaces of the substrate and the light-shielding films, the light-permeable protective film being made of a conductive metal material, wherein the light-shielding films are made of the same metal material as that of the light-permeable protective film.

2. A photo-mask according to claim 1, wherein the conductive metal material is selected from the group consisting of Ta, Ti, Mo, Ni, Au and Cr.

3. A photo-mask according to claim 1, wherein the light-permeable protective film is made of Ta and has a thickness of 2 to 10 µm.

4. A photo-mask according to claim 3, wherein the surfaces of the light-shielding films are on a lower level than that of the light-permeable substrate.

5. A photo-mask according to claim 1, wherein the light-shielding films are made of a metal selected from the group consisting of Ta, Ti, Cr and Mo.

6. A photo-mask according to claim 1, wherein the metal material is one of Ta and Ti.

7. A photo-mask according to claim 1, wherein the light-shielding films are buried in the light-permeable substrate.

8. A photo-mask according to claim 1, wherein the surfaces of the light-shielding films are on a higher level than that of the light-permeable substrate.

9. A photo-mask according to claim 1, wherein the surfaces of the light-shielding films are on approximately the same level as that of the light-permeable substrate.

10. A photo-mask according to claim 1, wherein the light-permeable substrate is made of a glass substance selected from the group consisting of quartz and soda glass.

11. A photo-mask according to claim 1, wherein the light-permeable substrate is made of a plastic selected from the group consisting of acrylic resins and epoxy resins.

12. A photo-mask used in production of an optical memory element in which occurrence or accumulation of static electricity is prevented,
wherein the photo-mask comprises a light-permeable substrate, a plurality of light-shielding films that are made of Ta and disposed on the substrate, the light-shielding films forming a mask-pattern, and a light-permeable protective film which covers the surfaces of the substrate and the light-shielding films, and the light-permeable protective film is made of Ta and has a thickness of 2 to 10 µm.

* * * * *